United States Patent [19]

Minakuchi

[11] 4,301,422
[45] Nov. 17, 1981

[54] FREQUENCY SYNTHESIZER

[75] Inventor: Hiroshi Minakuchi, Kadoma, Japan

[73] Assignee: Matsushita Electric Industrial Co., Ltd., Osaka, Japan

[21] Appl. No.: 28,750

[22] Filed: Apr. 10, 1979

Related U.S. Application Data

[62] Division of Ser. No. 865,120, Dec. 28, 1977, Pat. No. 4,207,539.

[30] Foreign Application Priority Data

Dec. 29, 1976 [JP] Japan ............................ 51/159609

[51] Int. Cl.³ .............................................. H03L 7/18
[52] U.S. Cl. .................................... 331/1 A; 307/273; 331/8; 331/25; 331/27
[58] Field of Search ................... 331/1 A, 16, 18, 25, 331/27

[56] References Cited

U.S. PATENT DOCUMENTS

| | | | |
|---|---|---|---|
| 2,963,648 | 12/1960 | Baskin et al. | 331/8 X |
| 3,130,376 | 4/1964 | Ross | 331/18 |
| 3,249,886 | 5/1966 | Anderson et al. | 331/8 X |
| 3,431,509 | 3/1969 | Andrea | 331/27 X |
| 4,009,449 | 2/1977 | Agans | 331/16 |
| 4,055,814 | 10/1977 | Abraham et al. | 331/27 X |

*Primary Examiner*—Siegfried H. Grimm
*Attorney, Agent, or Firm*—Pollock, VandeSande & Priddy

[57] ABSTRACT

A first frequency-to-voltage converter develops a first voltage representative of a standard frequency. A variable frequency source is provided to furnish a pulse sequence with constant-duration but variable repetition pulses. A frequency-to-voltage converter receives the pulse sequence to develop a second voltage representative of a total pulse energy generated in the pulse sequence per unit time. The deviation of the second voltage from the first voltage is detected by a comparator to control the variable frequency source to derive a desired frequency.

9 Claims, 13 Drawing Figures

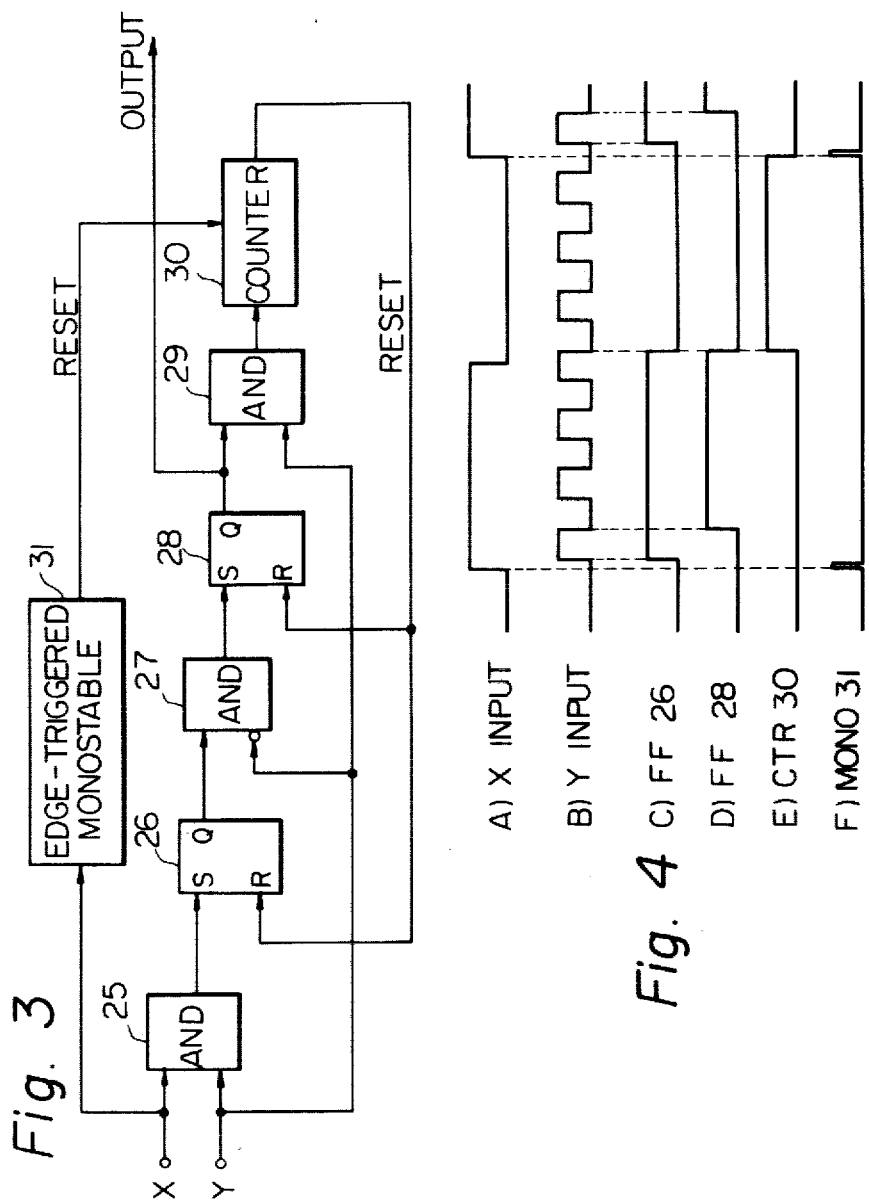

FREQUENCY SYNTHESIZER

This is a division of application Ser. No. 865,120, filed Dec. 28, 1977 and now U.S. Pat. No. 4,207,539.

BACKGROUND OF THE INVENTION

The present invention relates to frequency synthesizers.

Various frequency synthesizers have been proposed in the past. Frequency synthesizers of the type capable of providing highly stablized operation as well as of permitting manual control to any desired frequency would require a number of quartz crystal elements, or involve the use of a variable ratio frequency scaler coupled to a single source of crystal-controlled oscillator. Another approach would be to employ a phase-locked loop. However, any one of these approaches provides frequency changes in only steps of discrete amount of frequencies. This is particularly disadvantageous for amateur radio transmitters where frequency must be continuously changed within a limited bandwidth for tuning purposes, as well as for record and tape playing apparatus where the rotation of their drive systems is controlled continuously with respect to a standard frequency.

Although it may be possible with the prior art approaches to meet such requirements by providing as many discrete steps as desired, a great number of circuit components will be necessary. Conventional LC or CR oscillators may serve the purpose of providing continuous frequency variations. However, frequency stability requirement cannot be satisfied.

SUMMARY OF THE INVENTION

A principal object of the invention is therefore to provide a frequency synthesizer which is capable of providing continuous frequency variations while at the same time providing frequency stability once the desired frequency is attained.

Another object of the invention is to provide a frequency synthesizer which is simple in construction and lower cost to manufacture.

According to the invention, the frequency synthesizer includes a variable frequency pulse source for furnishing constant-duration, but variable repetition-rate pulses. A frequency-to-voltage converter, connected to the pulse source, converts the pulses into a voltage signal of which the magnitudes represents a total pulse energy delivered per unit time and therefore an accurate measure of the repetition frequency of the pulses. The frequency-representative voltage is compared with a reference voltage to derive a control signal representative of the deviation of the pulse repetition rate from the standard repetition rate represented by the reference voltage. The control signal is applied for feedback operation to the variable frequency pulse source to vary its frequency until the magnitude of the control signal reduces to zero. A desired frequency can be obtained by the provision of a variable resistance element in the frequency-to-voltage converter such that the frequency-representative voltage is varied with respect to the reference level.

In a specific aspect of the invention, the variable frequency pulse source includes a voltage-controlled oscillator and a monostable circuit which generates a pulse in response to each oscillation of the VCO signal with a duration which is a function of the period of the standard frequency signal. The monostable circuit specifically includes a first bistable circuit operative to assume a first binary state in response to the simultaneous presence of the variable and standard frequency oscillations both being at a first or high voltage level. A second bistable circuit, connected to the first bistable, is operative to assume a first binary state in response to a standard frequency oscillation being at a second or low voltage level in the presence of the first binary state of the first bistable circuit. A binary counter, connected to the second bistable circuit, furnishes a signal which signifies a predetermined number of standard frequency oscillations occurring in the presence of the first binary state of the second bistable. The counter output is used to reset the first and second bistable circuits to a second state. The counter is reset in response to the leading edge of each variable frequency oscillation.

For accurate frequency control purposes, the reference level is preferably established by means of a set of another monostable circuit and another frequency-to-voltage converter respectively identical with those as described above. In this instance, a frequency divider or scaler is connected between a standard frequency source and the additional monostable circuit to control the frequency of the latter; the pulse duration of the latter is controlled by the period of the standard frequency in the same manner as the monostable of the variable frequency pulse source.

BRIEF DESCRIPTION OF THE DRAWINGS

These and other objects, advantages and features of the invention will become apparent from the following detailed description when taken in conjunction with the accompanying drawings, in which:

FIG. 3 is an illustration of a monostable circuit of FIG. 1;

FIG. 4 illustrates waveforms useful for description of the monostable circuit of FIG. 3;

DETAILED DESCRIPTION

Figure 1:
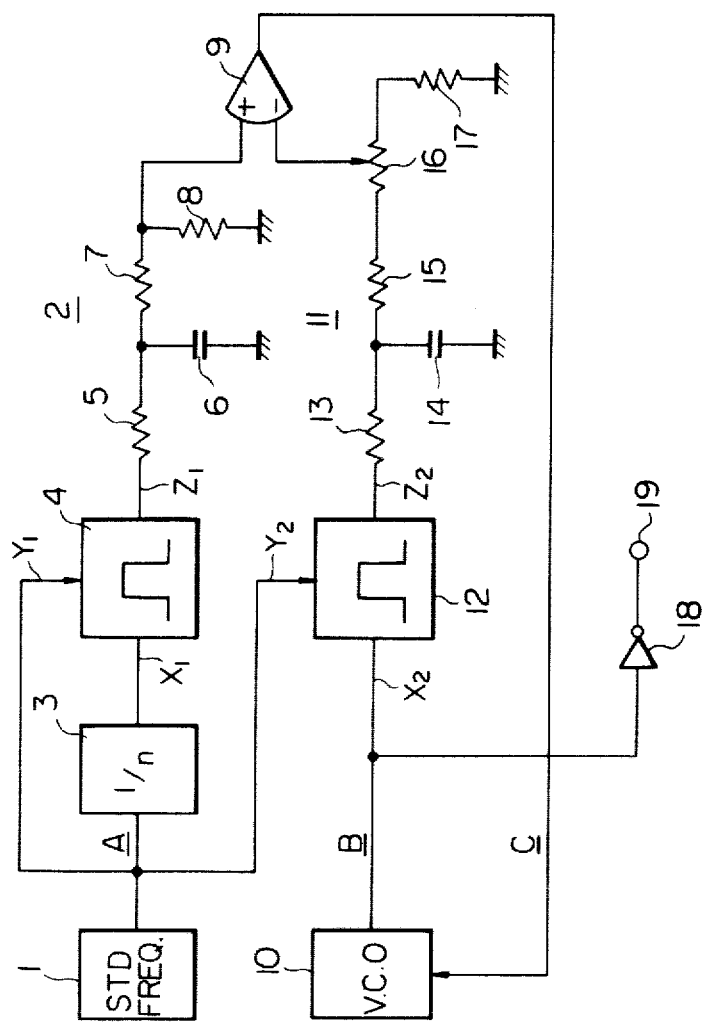
FIG. 1 is an illustration of an embodiment of the invention.

The variable frequency synthesizer of the invention represented in FIG. 1 comprises a first channel A, a second channel B and a feedback channel C. The first channel A is connected between a standard frequency source 1 or crystal-controlled oscillator and the positive input of a comparator 9 and the second channel B is connected between a variable frequency source 10 or voltage-controlled oscillator and the negative input of the comparator 9. The feedside channel is formed by a connection between the output of comparator 9 and the frequency control input of the variable frequency oscillator 10. The first channel A includes, in this illustration, a frequency divider or scaler 3 and a monostable circuit 4. The frequency scaler 3 provides an output at frequency 1/n of the standard frequency to an $X_1$ input of the monostable circuit 4. The latter also receives another input signal at input $Y_1$ from the standard frequency source 1. The function of the monostable circuit 4 is to produce a pulse of a constant duration, which is determined by the constant frequency of the source 1, in response to each cycle or oscillation of the frequency scaler 3. The first channel A further includes a filter circuit 2 connected to an output $Z_1$ of the monostable circuit 4 to produce a voltage signal representing the total duration of the pulses delivered within a given period of time. The filter circuit 4 includes a voltage divider formed by a set of resistors 5, 7 and 8 and connected in series between output $Z_1$ and ground, and a capacitor 6 connected between the junction of resistors 5, 7 and ground, the junction between resistors 7 and 8 being connected to the positive terminal of comparator 9.

The second channel B comprises a monostable circuit 12 which is preferably of the same construction as monostable circuit 4 and connected to be responsive to a first input from the variable frequency oscillator 10 on input $X_2$ and a second input from the standard frequency source 1 on input $Y_2$. Similarly, the monostable circuit 12 provides a pulse of a duration, which is determined by the period of the standard frequency signal, in response to each cycle or oscillation of the variable frequency oscillator 10. A filter circuit 11 is included in the channel B which includes a voltage divider formed by resistors 13, 15, 16 and 17 connected in series between output $Z_2$ of the monostable 12 and ground, and a capacitor 14 connected between the junction of resistors 13, 15 and ground. Resistor 16 is a variable resistance and the voltage applied to the negative input of comparator 9 is taken from the wiper terminal of the variable resistor 16.

Now, let us denote the values of resistors 5, 7, 8, 13, 15, 16 and 17 as $R_5$, $R_7$, $R_8$, $R_{13}$, $R_{15}$, $R_{16}$ and $R_{17}$, respectively. Assuming that the pulse amplitudes of the monostable circuits 4 and 12 are equal to each other, voltages $V_6$ and $V_{14}$ developed across capacitors 6 and 14 will respectively be given as follows:

$$V_6 = \frac{(R_7 + R_8)T_{H1} \cdot V_{cc}}{(R_5 + R_7 + R_8)(T_{H1} + T_{L1})} \quad (1)$$

$$V_{14} = \frac{(R_{15} + R_{16} + R_{17})T_{H2} \cdot V_{cc}}{(R_{13} + R_{15} + R_{16} + R_{17})(T_{H2} + T_{L2})} \quad (2)$$

where, $T_{H1}$ and $T_{L1}$ are the active and inactive periods, respectively, of the pulse sequence from monostable circuit 4, $T_{H2}$ and $T_{L2}$ are the active and inactive periods, respectively, of the pulse sequence from monostable circuit 12, and $V_{cc}$ is the supply voltage. Assume that $R_5 = R_{13}$ and $R_7 + R_8 = R_{15} + R_{16} + R_{17}$ and since $T_{H1} = T_{H2} = T_H$ so that the following Equation holds, $$\frac{R_7 + R_8}{R_5 + R_7 + R_8} \cdot V_{cc} = \frac{R_{15} + R_{16} + R_{17}}{R_{13} + R_{15} + R_{16} + R_{17}} \cdot V_{cc} = V_K \quad (3)$$

Equations (1) and (2) can be rewritten as follows:

$$V_6 = (T_H/T_H + T_{L1}) \cdot V_K \quad (4)$$

$$V_{14} = (T_H/T_H = T_{L2}) \cdot V_K \quad (5)$$

Since the input impedance of the positive and negative inputs of comparator 9 can be considered as having an infinite value, the voltages $V_p$ and $V_n$ at the positive and negative inputs, respectively, of the comparator 9 are given as follows:

$$V_P = (R_8 V_6 / R_7 + R_8) \quad (6)$$

$$V_p = V_6/2 = V_K \cdot T_H/2(T_H + T_{L1}) \quad (7)$$

$$V_n = \frac{V_{14}}{1 + R_I/R_{II}} = \frac{T_H \cdot V_K}{(1 + R_I/R_{II})(T_H + T_{L2})} \quad (8)$$

where, $R_I$ is a combined value of resistor $R_{15}$ and the partial resistance of resistor $R_{16}$ measured from its left end to which resistor $R_{15}$ is connected to the wiper terminal, and $R_{II}$ is a combined value of resistor $R_{17}$ and the remainder of resistor $R_{16}$. The frequency $f_s$ of the signal delivered from the frequency scaler 3 and the frequency $f_v$ of the variable frequency oscillator 10 are respectively given as follows:

$$f_s = (1/T_H + T_{L1}) \quad (9)$$

$$f_v = 1//T_H + T_{L2}) \quad (10)$$

The comparator 9 delivers a control signal which corresponds to the difference between the input voltages $V_p$ and $V_n$, so that feedback operation will be continued until the comparator output decreases to zero. Under this equilibrium condition, the input two voltages are equal to each other.

By equating Equations (7) and (8) and substituting Equations (9) and (10), frequencies $f_s$ and $f_v$ have the following relation:

$$f_v = [R_I/2R_{II} + \tfrac{1}{2}] \cdot f_s \quad (11)$$

Therefore, it is seen that the output frequency of the variable frequency oscillator 10 can be determined by the voltage dividing ratio of the variable resistor 16 and by the standard frequency. Since the standard frequency is constant, adjustment of variable resistor 16 permits continual variation of the output frequency to a desired value. From a practical standpoint, however, the same type of resistance should preferably be employed for resistors 15 and 17 to minimize the effect of resistance variations as a function of aging and temperature although a different resistance type may be used for the variable resistor 16, since the voltage at the terminal point of the latter is not subject to vary as a function of such factors. Furthermore, to minimize the voltage variations across the capacitor 14 as a function of the resistance variations, the resistance $R_{13}$ should preferably be much smaller than the combined resistance of $R_{15}$, $R_{16}$ and $R_{17}$, and the resistance $R_{16}$ should also be sufficiently smaller than the combined resistance of $R_{15}$ and $R_{17}$. Similarly, the resistance $R_5$ is preferably much smaller than the combined value of $R_7$ and $R_8$.

Figure 2:
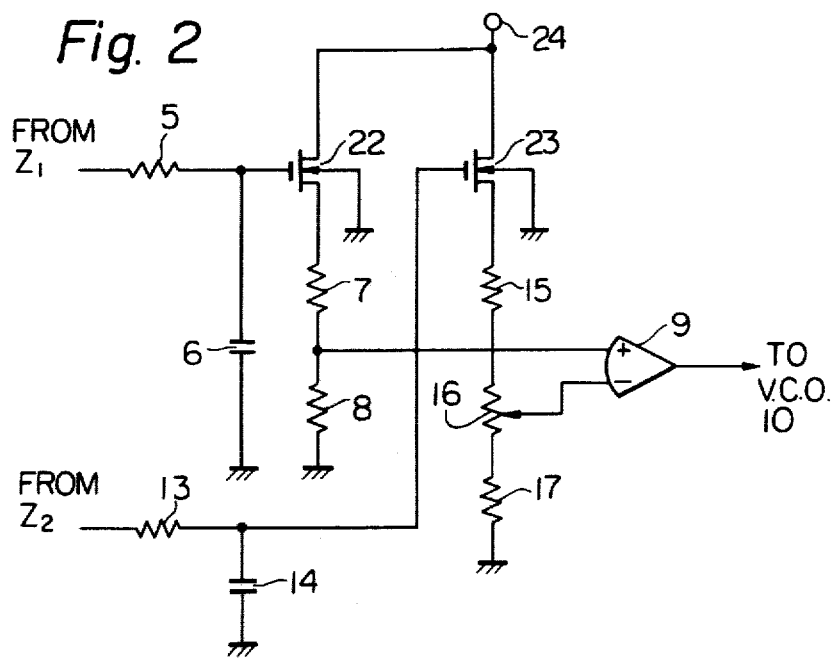
FIG. 2 is an illustration of a preferred arrangement of the embodiment of FIG. 1 with field-effect transistors shown serving as buffer amplifiers.

In order to make the system more immune to the effect of variation of resistor 16 due to aging and temperature, MOS field-effect transistors may be employed to serve as buffer or isolation amplifiers as illustrated in FIG. 2. In FIG. 2, resistors 7 and 8 are connected in series with MOSFET 22 to a voltage supply 24 with its gate electrode being connected to the junction between resistor 5 and capacitor 6. Similarly, MOSFET 23 is interposed between the voltage supply 24 and the resistor 15 with its control gate connected to the junction between resistor 13 and capacitor 14.

The output of the variable frequency synthesizer of the invention can be extracted from the output of the VCO 10 by way of a buffer amplifier 18 at terminal 19.

The present invention is further characterized by a novel construction of the monostable circuits 4 and 12. FIG. 3 illustrates a preferred embodiment of each of the monostable circuits 4 and 12. An AND gate 25 is provided to be responsive to the simultaneous occurrences of the oscillations, or pulsations of the signals at the X and Y input terminals of the monostable circuits (FIGS. 4A and 4B) to provide a logic "1" output to a first flip-flop 26 to turn it to a logic "1" state (FIG. 4C) which in turn enables an AND gate 27. A second flip-flop 28 is shown connected to the output of AND gate 27 which triggers flip-flop 28 to a logic "1" state in response to a change in the logic level of the signal on Y input to "0" (FIG. 4D) in the presence of the logic "1" state of flip-flop 26. With the flip-flop 28 being at logic "1" state, the pulses on input terminal Y are supplied through AND gate 29 to a three-bit binary counter 30. At a pulse count of three, the counter 30 produces an output (FIG. 4E) which is transmitted to the reset inputs of flip-flops 26 and 28 to allow them to return to the "0" logic state. The output of the counter 30 remains at the logic "1" state until it is reset in response to the leading edge of the next pulse on terminal X by means of an edge-triggered monostable multivibrator 31 connected to the X input terminal (FIG. 4F). The output of the monostable circuit is derived from the flip-flop 28. It will be seen that the active period, or pulse duration, of the output pulse sequence is determined by the frequency of the signal on input terminal Y, that is, the standard frequency, and that the pulse repetition frequency is determined by the signal on respective input terminals $X_1$ and $X_2$.

Since the duration of each pulse derived from the monostable circuit 12 corresponds to the total duration or pulse energy of three input cycles or pulsations on terminal $Y_2$, it is seen that the dividing factor n of the frequency scaler 3 should be an integer equal to or greater than twice the number of input pulses from terminal $Y_2$ for each of the monostable output pulses, that is, in this example, six.

Figure 5:
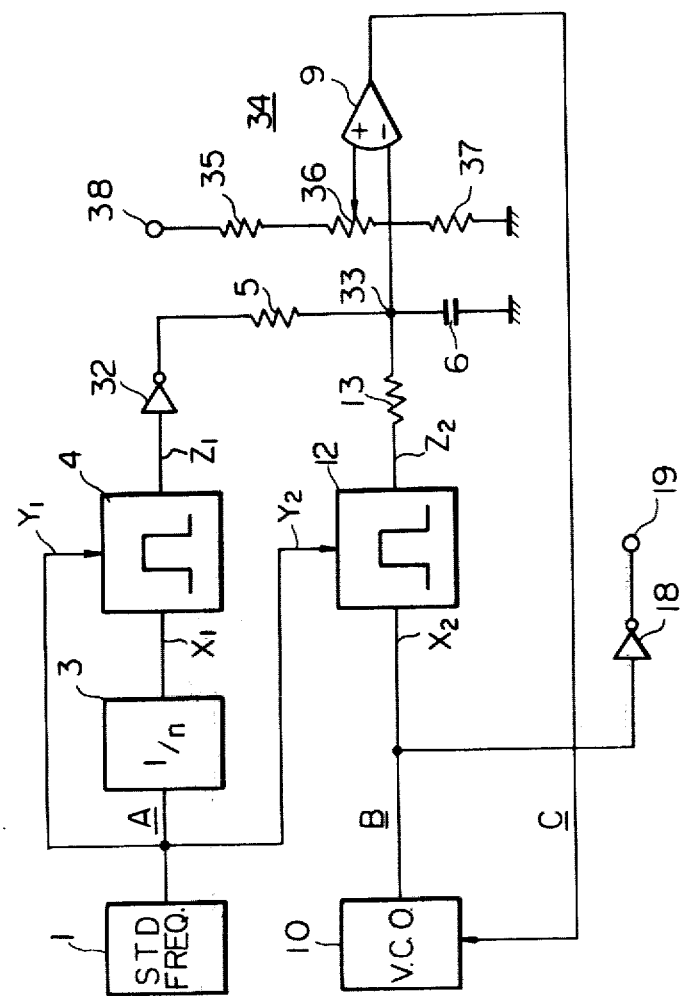
FIG. 5 is an illustration of a modification of the embodiment of FIG. 1.
Figure 6:
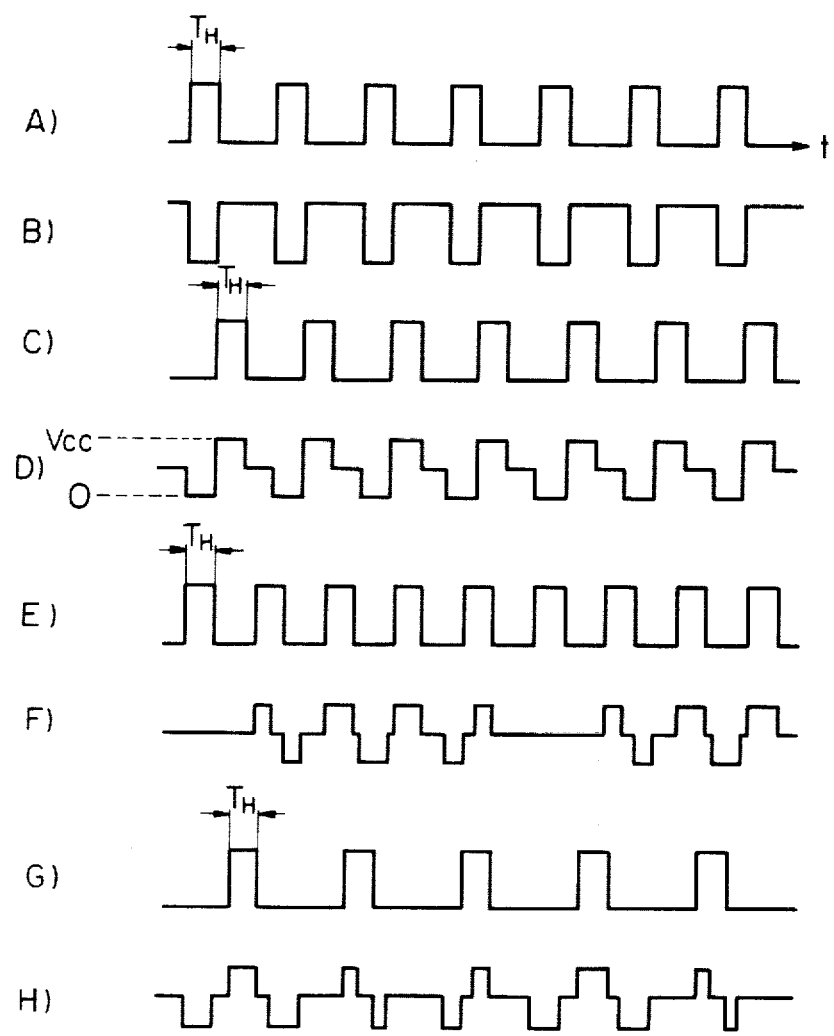
FIG. 6 illustrates waveforms useful for description of the embodiment of FIG. 5.

FIG. 5 illustrates a modification of the embodiment of FIG. 1 in which the identical parts with those shown in the previous embodiment are numbered with the same numerals. In this modification, the output $Z_1$ of the monostable circuit 4 is connected to an inverting amplifier 32 which inverts the polarity of the monostable 4 output and feeds the polarity-inverted pulse sequence to a summing junction 33 by way of resistor 5. Capacitor 6 serves as a common capacitance element for the channels A and B. Since the pulse sequence on channel A is polarity-inverted, the voltage across the capacitor and therefore the summing junction 33 is an algebraical summation of the two pulse sequences of the channels A and B. The summation output is fed into the negative input of the comparator 9 for comparison with a variable reference voltage supplied from a voltage divider 34 formed by resistors 35, 36 and 37 connected in series between voltage supply 38 and ground, the resistor 36 being a variable resistor which supplies a threshold to the positive terminal of comparator 9. The operation of the circuit of FIG. 5 will be understood with reference to the waveforms shown in FIG. 6 in which the waveforms in FIGS. 6A and 6B are the pulse sequences appearing at the outputs of the monostable circuit 4 and the inverting amplifier 32, respectively. The waveform shown in FIG. 6C is a pulse sequence on channel B, that is, the signal derived from the monostable circuit 12 which is shown as having the same repetition rate as the pulses on channel A, but out of coincidence with the latter. FIG. 6D is an illustration of a combined waveform of the two pulse sequences developed at the summing junction 33. The combined output is smoothed out by the capacitor 6 so that the voltage thereacross is a DC voltage which corresponds to the mean value of the peak-to-peak value of the combined waveform. In this case, the DC voltage corresponds to a half of the source voltage Vcc. If the VCO frequency is assumed to have slightly increased as shown in FIG. 6E so that certain of the pulses of the two channels coincide with each other, the mean value of the peak-to-peak will be greater than Vcc/2, as will be seen from FIG. 6F. This is analogous to a situation in which the voltage at the positive terminal of comparator 9 has been increased to that level by adjustment of the variable resistor 36. If the VCO frequency is assumed to have slightly lowered as shown in FIG. 6G, the mean value of the peak-to-peak of the combined output will be smaller than Vcc/2 as is seen from FIG. 6H. This is analogous to a situation in which the threshold has been manually lowered to that level. Therefore, it will be understood that the output frequency of the modified embodiment can also be manually controlled by adjustment of the variable resistor 36 in a similar manner to that described in connection with the previous embodiment. Since the modified embodiment shown in FIG. 5 accomplishes the waveform smoothing operation with a single capacitor, the circuit of FIG. 5 is more suitable for adaptation to integrated circuit techniques than is the case for the previous embodiment in which two capacitors are employed.

Figure 7:
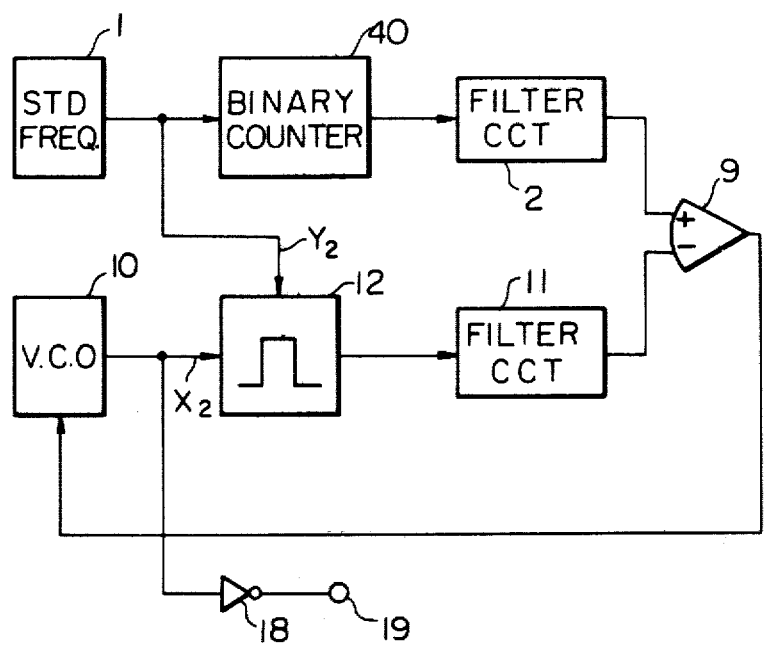
FIG. 7 is an illustration of a further modification of the embodiment of FIG. 1.
Figure 8:
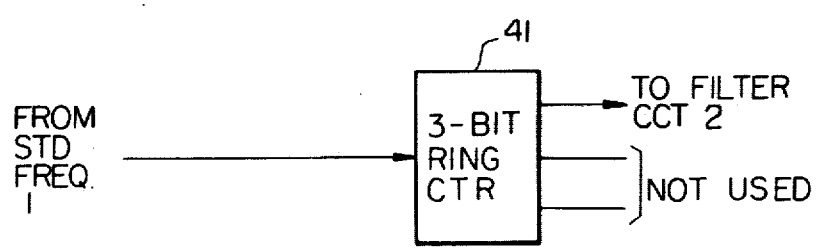
FIG. 8 is an illustration of a modification of the embodiment of FIG. 7.

In a digital embodiment, the frequency scaler 3 can be constructed of a (n/2)-bit binary counter including a chain of cascaded flip-flops. For example, assuming that the monostable circuit 12 is of the construction shown in FIG. 3, a three-bit counter can serve as the frequency scaler 3. In this case, monostable circuit 4 can be dispensed with since the output pulse of the binary counter has an equal pulse duration to that of the output of monostable circuit 12. Therefore, the previous embodiments can be modified as shown in FIG. 7 using a (n/2)-bit binary counter 40 to replace the frequency scaler 3 and monostable circuit 4. In the above example, the binary counter 40 produces a pulse train of 50% duty cycle. However, it is possible to alter the duty cycle by replacing the binary counter 40 with a ring counter 41 as illustrated in FIG. 8. A 3-bit ring counter 41 produces a pulse train with a duty cycle of 33.3%. In this example, any one of the output terminals is connected to the filter circuit 2 and the other terminals are left unconnected.

Figure 9:
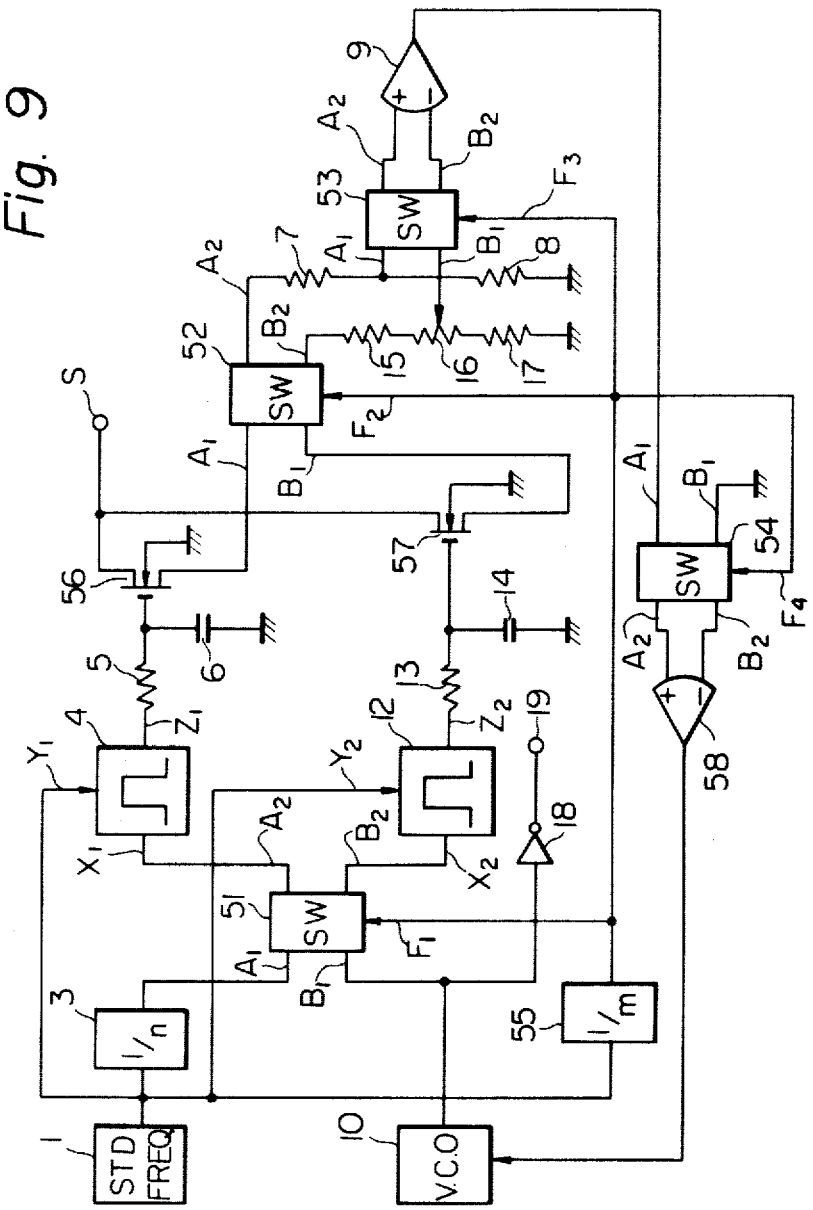
FIG. 9 is an illustration of a still further modification of the embodiment of FIG. 1.

A further modification of the embodiment of FIG. 1 is illustrated in FIG. 9 which is particularly suitable for high precision frequency control purposes. In this embodiment, errors which may have been introduced by inherent variations in circuit component values are compensated by periodically switching the channels A and B at several points of the system. In FIG. 9, four synchronized switching devices 51, 52, 53 and 54 are provided. A frequency scaler or divider 55 is shown connected to the standard frequency source 1 to provide frequency division of 1/m, where m is an integer several times greater than n. The output of the frequency divider 55 is supplied to terminal F of the switching devices 51 to 54 for synchronization purposes. Each of the switching devices 51 to 54 has a double-pole-double-throw configuration so that channel A is normally coupled through the terminals $A_1$ and $A_2$ of each switching device and channel B is coupled through terminals $B_1$ and $B_2$. In response to a pulse from the synchronization source 55 the switching devices 51 to 54 simultaneously switch their paths so that channels A and B are cross-coupled at switch 51 through its terminals $A_1$ and $B_2$ on the one hand, and through its terminals $B_1$ and $A_2$ on the other hand. As a result, the standard frequency signal and the VCO signal are interchanged at the input terminals $X_1$ and $X_2$ of the monostable circuits 4 and 12. The VCO signal, appearing at the output of monostable circuit 4, is coupled through a MOSFET 56 to the $A_1$ terminal of the switch 52 and thence to its $B_2$ terminal, to the $B_1$ to $A_2$ terminals of switch 53. The standard frequency signal is routed through the $A_1$ to $B_2$ terminals of switch 51, through monostable 12 and coupled through MOSFET 57 to the $B_1$ to $A_2$ terminals of switch 52 and then through the $A_1$ to $B_2$ terminals of switch 53 for comparison with the VCO signal at the positive terminal of the comparator 9. The polarity of the signal at the output of comparator 9 is thus reversed to that of the previous embodiment. The comparator output is reversed in polarity by the switching device 54. This switch normally couples a ground potential through its terminal $B_1$ and $A_2$ to the positive input of a comparator 58 and the comparator 9 output through terminals $A_1$ and $B_2$ to the negative input of the comparator 58. The output of the comparator 58 is connected to the variable frequency oscillator 10.

Figure 10:
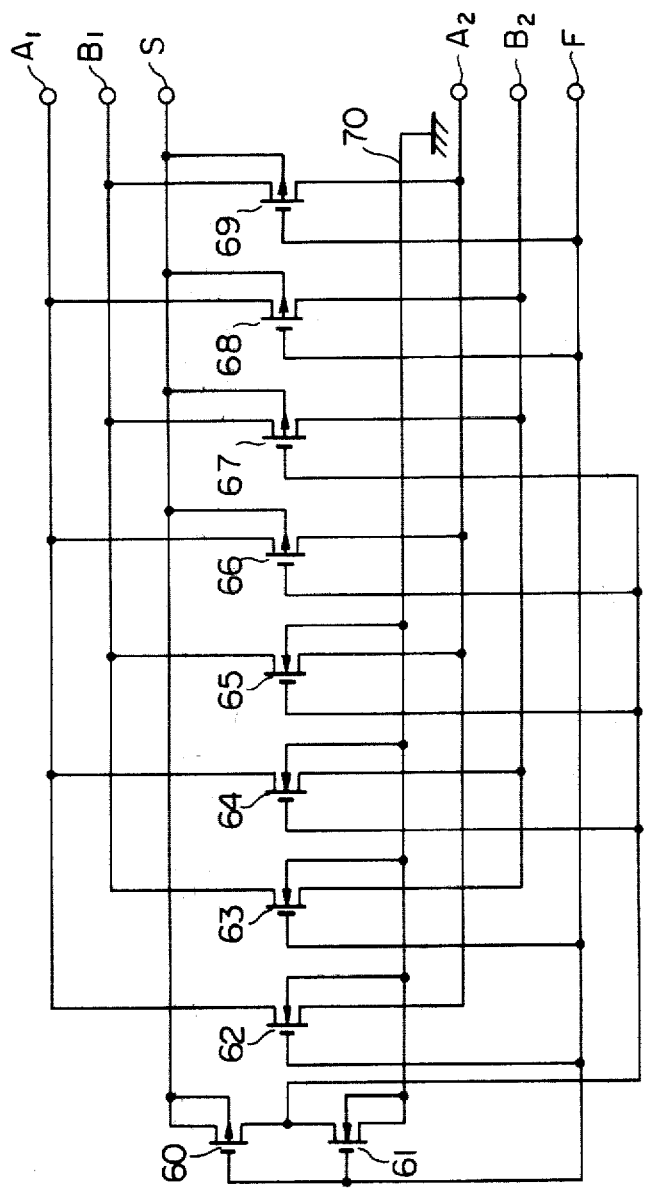
FIG. 10 is an illustration of a synchronized switching device of the embodiment of FIG. 9.

FIG. 10 is an exemplary illustration of each of the switching devices 51 through 54. The switching device comprises N-channel enhancement MOSFETs 61, 62, 63, 64, and 65 and P-channel enhancement MOSFETs 60, 66, 67, 68 and 69. The synchronization terminal F is coupled to the control gates of MOSFETs 60, 61, 62, 63, 68 and 69. A high-level potential on terminal F will turn on N-channel transistors 61, 62 and 63, and the turn-on of transistor 61 couples a low-level, or ground potential through leads 70 and 71 to the control gates of P-channel transistors 66 and 67 to turn them on. Under this condition, terminals $A_1$ and $A_2$ are connected by the conductive transistors 61 and 66 and terminals $B_1$ and $B_2$ are connected by the conductive transistors 63 and 67. When the polarity of the potential at terminal F is reversed, transistors 68 and 69 will be turned on, and at the same time transistor 60 will be turned on to couple a high-level potential from source terminal S to the control gates of N-channel transistors 64 and 65 to turn them on. Thus, terminal $A_1$ is cross-coupled to terminal $B_2$ by way of transistors 64 and 68 and terminal $B_1$ is cross-coupled to terminal $A_2$ by way of transistors 65 and 69.

Figure 11:
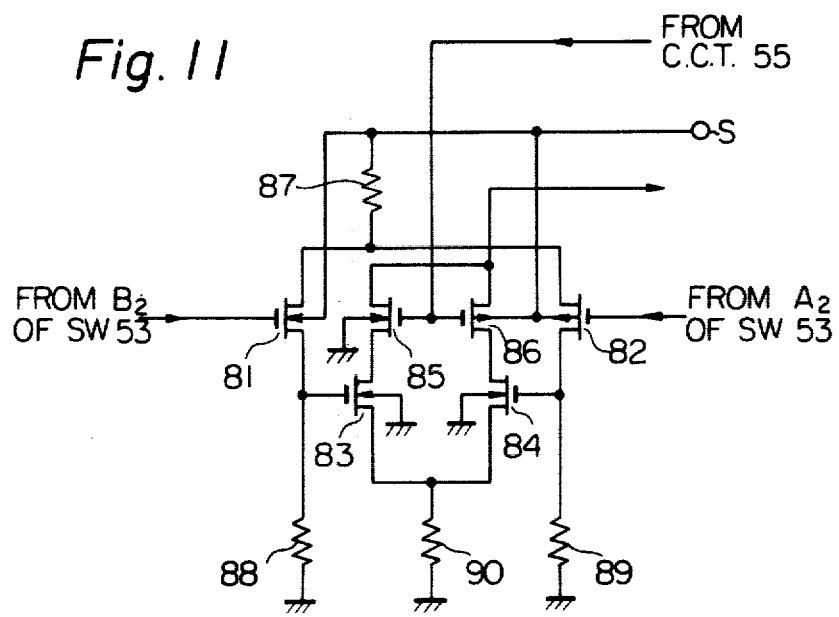
FIG. 11 is an illustration of a practical arrangement of a portion of the embodiment of FIG. 9.

Referring back again to the embodiment of FIG. 9, the circuit comprised of comparator 9, switch 54 and comparator 58 can be arranged in a more simplified circuit configuration as illustrated in FIG. 11. An N-channel MOSFET 81 and a P-channel MOSFET 82 are shown connected at their source electrodes to the voltage source terminal S through a common load resistor 87 and at their drain electrodes to ground through respective resistors 88 and 89 so as to form a differential amplifier, i.e. comparator 9. The control gates of the transistors 81 and 82 are respectively connected to be responsive to the signal on terminals $B_2$ and $A_2$ of the switching device 53. The switching device 54 is formed by an N-channel MOSFET 85 and a P-channel MOSFET 86 having their control gates connected together to the synchronization source 55 and the source electrodes connected together to frequency control terminal of the variable frequency oscillator 10. An N-channel MOSFET 83 is shown connected in series with the transistor 85 and a P-channel MOSFET 84 is connected in series with the transistor 86. The drain electrodes of the transistors 83 and 84 are connected together to ground by a common load resistor 90. The control gate of transistor 83 is connected to the drain electrode of the transistor 81 of the same conductivity type as transistor 83 so that the voltage developed across resistor 90 is in phase with the voltage developed across resistor 88. On the other hand, the control gate of transistor 84 is connected to the drain of transistor 82 of the opposite conductivity type to that of transistor 84 so that the voltage developed across the resistor 90 is opposite in phase to that developed across resistor 89. Therefore, the voltage across the resistor 90 is an algebraical summation of the voltages developed respectively across resistors 88 and 89. Transistors 85 and 86 are switched into conductive state in a complementary manner in response to the voltage state of the synchronization pulse from source 55. As a result, the voltage across resistors 90 is coupled alternately by way of the switching transistors 85 and 86 to the voltage controlled oscillator 10 with the polarity in reverse to that of the input signal supplied from the switching device 53 in response to each synchronization pulse.

Figure 12:
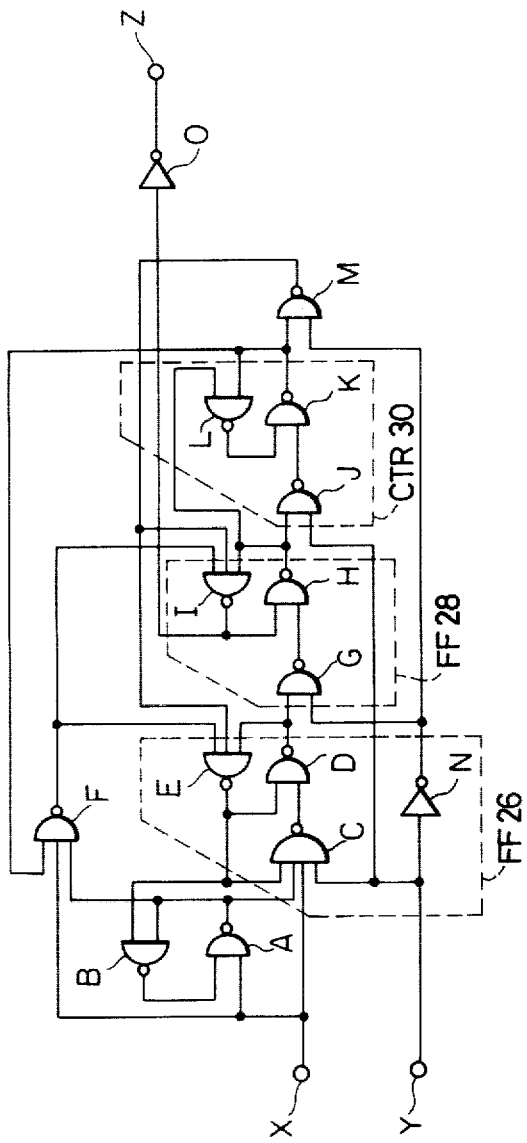
FIG. 12 is an illustration of a practical embodiment of the monostable circuit of FIG. 3.
Figure 13:
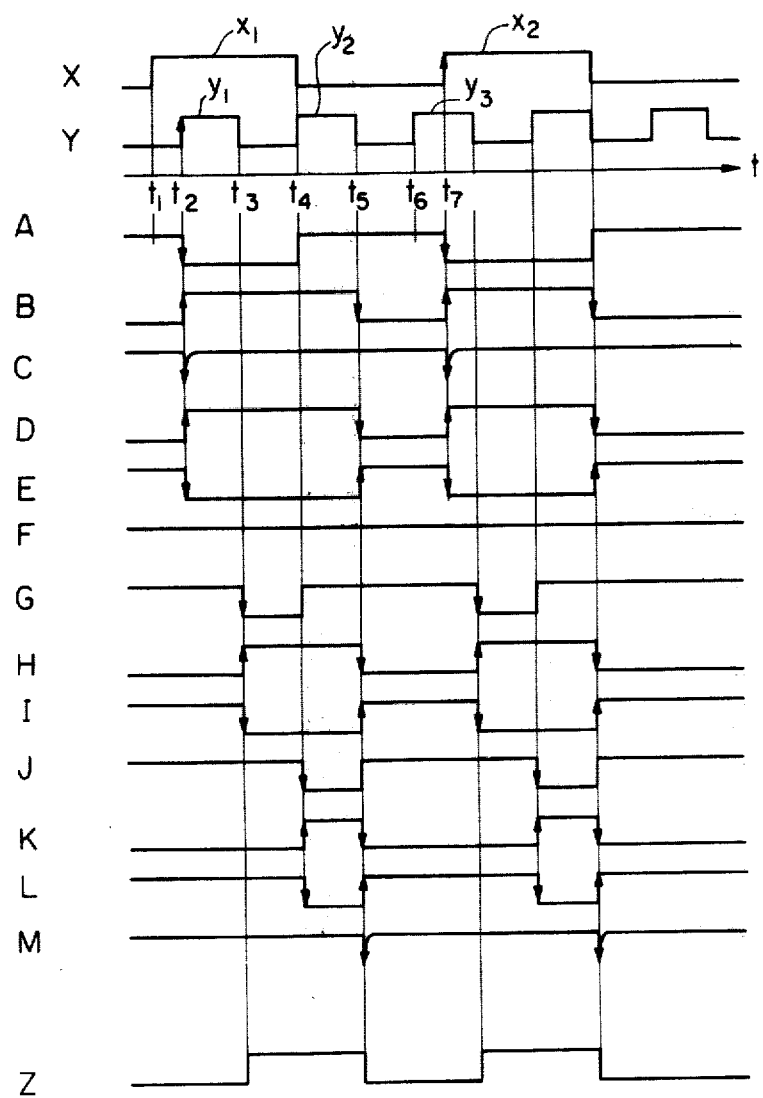
FIG. 13 is an illustration of waveforms useful for description of the embodiment of FIG. 12.

FIG. 12 is an illustration of a practical embodiment of the monostable circuit as described in connection with FIG. 3. The monostable circuit comprises a number of NAND gates A to M and NOT circuits N and O. NAND gates C, D and E and NOT circuit N constitute a first flip-flop circuit which corresponds to the flip-flop 26 of FIG. 3 and NAND gates G, H and I constitute a second flip-flop circuit which corresponds to the flip-flop 28 of FIG. 3. NAND gates J, K and L constitute a binary counter, in this embodiment a one bit counter, which corresponds to the counter 30 of FIG. 3. The description of FIG. 12 will now proceed with reference to a series of waveforms shown in FIG. 13 in which the characters on the left side of each waveform corresponds to the circuit elements in FIG. 12. Before application of a pulse "x1" on terminal X at time $t_1$, NAND gates E and I have been in receipt on a "0" logic reset pulse from NAND gate M to reset the first and second flip-flops to the original high or "1" logic state which has been coupled to NAND gates B, C, D and H. Because of the nature of the NAND gate which is in a "1" logic state in the presence of a "0" logic input to any one of its input terminals and switches to a "0" logic state in response to the simultaneous presence of "1" logic states to all of the input terminals, NAND gate A has been in a "1" logic state until a pulse "y1" on terminal Y coincides with pulse $X_1$ at time $t_2$. The "1" logic from NAND gate A has been coupled to the input terminal 2c of NAND gate C so that upon application of the "x1" pulse to terminal X causes it to place a "0" logic on terminal Oc which is coupled to terminal 2d of NAND gate D to turn it to a "1" logic state which is in turn coupled to NAND gate E to turn it to a "0" logic state. Thus, NAND gates B, A and C are successively caused to change their binary states to "1", "0" and "1", respectively. At time $t_3$, the logic state of the pulse sequence on terminal Y changes to "0" which is inverted by NOT circuit N and coupled to NAND gate G. Since NAND gate D has been in a "1" logic state, NAND gate D changes its state to logic "0" resulting in a "1" logic state in NAND gate H, which in turn causes NAND gate I to turn to "0" output state. At time $t_4$, the logic state of terminal X changes to "0" resulting in a "1" logic output from NAND gate A. Simultaneously with this, the logic state of terminal Y changes to "1" upon application of pulse "y2" whose inverted "0" is coupled to NAND gate G to turn it to logic "1", and at the same time NAND gate J turns to "0" which in turn switches NAND gate K to "1" resulting in a "0" state at the output of NAND gate L.

At time $t_5$, the logic state of terminal Y changes to "0" which simultaneously turn NAND gates J and M to logic state "1" and "0", respectively. The "0" logic of NAND gates M is the reset pulse which is coupled to NAND gates E and I, to turn them to logic "1". NAND gate H is subsequently turned to logic "0" in response to the "1" state of NAND gate I. The "0" logic of NAND gate H is coupled to NAND gate L to turn it to logic "1" which results in NAND gate K turning to logic "0" state, thus terminating the "0" logic state of NAND gate M. On the other hand, the "1" logic state of NAND gate E causes NAND gates B and D to turn to the "0" state.

Logic state "1" at time $t_6$ on terminal Y due to the occurrence of pulse "y3" produces no subsequent change in logic states of the monostable circuit until time $t_7$ when pulse "x2" appears at terminal X, whereupon there occurs a series of similar events to those that occurred at time $t_2$. It will be understood that a series of logic changes which have occurred will be repeated in response to subsequent changes in logic state of the input terminals X and Y. The output pulse of the monostable circuit is available from output terminal Z connected to the output of NAND gate I through NOT circuit O. It will be seen from FIG. 13 that the duration of each output pulse from terminals Z corresponds to one cycle of the pulse sequence on terminal Y and that each output pulse occurs within each cycle of the input pulse on terminal X, and therefore the repetition rate is dependent upon the signal on terminal X.

When the frequency of the signal on terminal X is increased to the point of approaching the standard frequency, a condition is likely to occur wherein the signal on terminal X changes from the "0" logic state to the "1" logic state during the time when NAND gate K is in the "1" logic state. Under such circumstances, NAND gate M becomes irresponsive to such logic states and therefore no reset pulse is provided therefrom. It is NAND gate F that is brought into play in this situation to function as a resetting circuit instead of NAND gate M.

What is claimed is:

1. A variable frequency synthesizer comprising:
   a binary counter connected to a source of reference frequency signal for generating a first pulse with a duration corresponding to an integral multiple of the period of said reference frequency signal in response to a predetermined number of oscillations of said reference frequency signal;
   a variable frequency oscillator;
   a monostable device having a first input terminal connected to the output of said variable frequency oscillator and a second input terminal connected to said reference frequency source for generating a second pulse in response to each oscillation of the output signal from said variable frequency oscillator with a duration variable as a function of the period of said reference frequency signal;
   a differential integrator connected to be responsive to said first and second pulses for generating a voltage signal representative of the difference in duty cycle between said first and second pulses for application to the input of said variable frequency oscillator; and
   a variable resistance element having a manually adjustable, continuously variable resistance for varying said voltage signal, whereby the output signal of said oscillator is continuously variable as a function of the resistance of said variable resistance element.

2. A variable frequency synthesizer as claimed in claim 1, wherein said monostable device comprises:
   first bistable means for assuming a first binary state in response to the simultaneous presence of oscillations of said reference frequency signal and the output signal of said variable frequency oscillator;
   a second bistable means for assuming a first binary state, in the presence of the first binary state of said first bistable means, in response to the absence of the oscillation of said reference frequency signal; and
   counter means for generating a reset signal for resetting said first and second bistable means to a second binary state in response to a count of oscillations of said reference frequency signal generated in the presence of said first binary state of said second bistable means, said first binary state of said second bistable means corresponding to said second pulse.

3. A variable frequency synthesizer as claimed in claim 1, wherein said differential integrator comprises:
   a first smoothing circuit connected to the output of said binary counter for generating a first voltage signal having a voltage level proportional to the duty cycle of said first pulses;
   a second smoothing circuit connected to the output of said monostable device for generating a second voltage signal having a voltage level proportional to the duty cycle of said second pulses; and
   a differential amplifier having a first input terminal responsive to said first voltage signal and a second input terminal responsive to said second voltage signal to provide a differential output signal for application to the input of said variable frequency oscillator.

4. A variable frequency synthesizer as claimed in claim 3, wherein each of said first and second smoothing circuits comprises an identical resistor-capacitor network and a voltage dividing network connected to said resistor-capacitor network.

5. A variable frequency synthesizer as claimed in claim 4, wherein said variable resistance element is connected between said second smoothing circuit and the second input terminal of said differential amplifier, and wherein the voltage dividing network of the first smoothing circuit comprises first and second fixed-value resistances connected in a series circuit, and the voltage dividing network of the second smoothing circuit comprises third and fourth fixed-value resistances connected in a series circuit between the associated resistor-capacitor network and said variable resistance element, the combined resistance of said first and second resistances having an equal value to the combined resistance of said third and fourth resistances and said variable resistance element.

6. A variable frequency synthesizer as claimed in claim 4, wherein the resistance of said resistor-capacitor network of each of said first and second smoothing circuits is much smaller than the combined resistance of the respective voltage dividing network.

7. A variable frequency synthesizer as claimed in claim 4, further comprising a buffer amplifier connected between the resistor-capacitor network and the voltage dividing network of each smoothing circuit.

8. A variable frequency synthesizer as claimed in claim 7, wherein said buffer amplifier is a field-effect transistor.

9. A variable frequency synthesizer as claimed in claim 1, wherein said binary counter is a ring counter.

* * * * *